(12) United States Patent
Awata et al.

(10) Patent No.: US 8,196,287 B2
(45) Date of Patent: Jun. 12, 2012

(54) ELECTRONIC COMPONENT INSTALLATION APPARATUS

(75) Inventors: Yoshiaki Awata, Yamanashi (JP);
Wataru Hidese, Fukuoka (JP);
Kazuhide Nagao, Yamanashi (JP);
Takuya Tsutsumi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 11 days.

(21) Appl. No.: 12/936,242

(22) PCT Filed: Mar. 25, 2009

(86) PCT No.: PCT/JP2009/001343
§ 371 (c)(1),
(2), (4) Date: Oct. 4, 2010

(87) PCT Pub. No.: WO2009/122682
PCT Pub. Date: Oct. 8, 2009

(65) Prior Publication Data
US 2011/0023294 A1    Feb. 3, 2011

(30) Foreign Application Priority Data

Apr. 4, 2008   (JP) .................................. 2008-097906

(51) Int. Cl.
*B23P 19/00* (2006.01)
(52) U.S. Cl. ............ 29/740; 29/429; 29/33 P; 29/564.1; 29/741; 29/832; 198/465.1
(58) Field of Classification Search ............ 29/740–742, 29/833–834; 414/737, 783, 224.01; 198/345.1, 198/346.2, 349, 358
See application file for complete search history.

(56) References Cited

U.S. PATENT DOCUMENTS

| | | | | |
|---|---|---|---|---|
| 4,708,582 A | * | 11/1987 | Hamada et al. | 414/800 |
| 5,271,139 A | * | 12/1993 | Sticht | 29/430 |
| 5,781,988 A | * | 7/1998 | Faraoni et al. | 29/735 |

(Continued)

FOREIGN PATENT DOCUMENTS

JP          4-129630 A       4/1992

(Continued)

OTHER PUBLICATIONS

International Search Report for Appl. No. PCT/JP2009/001343 dated Apr. 28, 2009.

*Primary Examiner* — Minh Trinh
(74) *Attorney, Agent, or Firm* — Pearne & Gordon LLP

(57) ABSTRACT

An electronic component installation apparatus 4 which constructs an electronic component mounting line 1 and installs an electronic component on a substrate is configured to include substrate conveyance lanes L1, L3 as two conveyance paths for feed which respectively feed the substrate carried from the upstream side to the downstream side, the conveyance paths for feed in which substrate positioning parts for positioning and holding the substrate in installation work positions are disposed between two component installation parts 22A, 22B for taking the electronic components out of component supply parts 23A, 23B and transferring and installing the electronic components to the substrate, and a substrate conveyance lane L2 as a return conveyance path which returns the substrate carried from the downstream side to the upstream side and is disposed in a state of being sandwiched between the substrate conveyance lanes L1, L3.

5 Claims, 8 Drawing Sheets

U.S. PATENT DOCUMENTS

| | | | |
|---|---|---|---|
| 6,061,899 A * | 5/2000 | Cardini et al. | 29/736 |
| 7,032,304 B2 * | 4/2006 | Gieskes | 29/832 |
| 7,036,213 B2 * | 5/2006 | Kabeshita et al. | 29/740 |
| 7,200,922 B2 * | 4/2007 | Kabeshita et al. | 29/740 |
| 2004/0128827 A1 | 7/2004 | Shimizu et al. | |
| 2010/0050426 A1 | 3/2010 | Shimizu et al. | |

FOREIGN PATENT DOCUMENTS

| | | |
|---|---|---|
| JP | 2003-204191 A | 7/2003 |
| JP | 2004-128245 A | 4/2004 |
| JP | 2004-128400 A | 4/2004 |
| WO | 0217699 A1 | 2/2002 |

* cited by examiner

ELECTRONIC COMPONENT INSTALLATION APPARATUS

TECHNICAL FIELD

The present invention relates to an electronic component installation apparatus which constructs an electronic component mounting system for mounting an electronic component on a substrate and manufacturing a mounting substrate and transfers and installs the electronic component to the substrate.

BACKGROUND ART

An electronic component mounting line for mounting an electronic component on a substrate and manufacturing a mounting substrate is constructed by joining a screen printing apparatus for printing paste for solder bonding on the electronic component, an electronic component installation apparatus for installing the electronic component in the substrate after printing, etc. In recent years, also in the electronic industry, multikind small-quantity production becomes mainstream in a production form and an equipment configuration having flexibility capable of coping with various production forms together with high production efficiency is desired also in production equipment.

In order to implement such production equipment, various characteristic mechanisms are conventionally introduced into an apparatus for constructing the electronic component mounting line or a layout of the electronic component mounting line. For example, a configuration (for example, see Patent Reference 1) including plural substrate conveyance conveyors capable of operation independently is used for the purpose of simultaneous conveyance of plural substrates or an improvement in conveyance efficiency of the substrate, etc. Consequently, equipment with good multikind adaptability capable of production of plural kinds of substrates simultaneously while the plural substrates can simultaneously be produced and production efficiency is good can be implemented.

Patent Reference 1: JP-A-4-129630

DISCLOSURE OF THE INVENTION

Problems that the Invention is to Solve

However, the related art example shown in Patent Reference 1 has the following problem. That is, in recent years, by an increase in mounting density, a double-sided mounting form of mounting electronic components on two sides of the front and back of the substrate becomes normal, and substrate conveyance work for again returning the substrate in which mounting work of the single side is completed to the upstream side of the electronic component mounting line is required. However, in the conventional electronic component installation apparatus including Patent Reference 1, such substrate conveyance work is often done by manual conveyance by an operator and a saving in labor by complete automation of the substrate conveyance work was desired. Thus, the electronic component installation apparatus used in the conventional electronic component mounting line had a problem of being difficult to efficiently do component installation work for which plural substrates including a double-sided mounting substrate are targeted.

Therefore, an object of the invention is to provide an electronic component installation apparatus capable of efficiently doing component installation work for which plural substrates including a double-sided mounting substrate are targeted.

Means for Solving the Problems

An electronic component installation apparatus of the invention is the electronic component installation apparatus which constructs an electronic component mounting line by being joined to the downstream side of a printing apparatus for printing paste for electronic component bonding on a substrate and installs an electronic component on the substrate, and includes two component installation parts having component supply parts for supplying electronic components mounted on the substrate and component installation mechanisms for taking the electronic components out of the component supply parts and transferring and installing the electronic components to the substrate, the component installation parts being placed symmetrically with respect to a line centerline of the electronic component mounting line in plan view, two substrate positioning parts which are disposed in correspondence with each of the two component installation parts and position and hold the substrate in installation work positions by the component installation mechanisms, two conveyance paths for feed which respectively feed the substrate carried from the upstream side to the downstream side, the conveyance paths for feed in which the substrate positioning parts are disposed, and a return conveyance path which returns the substrate carried from the downstream side to the upstream side and is disposed in a state of being sandwiched between the two conveyance paths for feed.

Advantage of the Invention

By being configured to include the two conveyance paths for feed which feed the substrate carried from the upstream side to the downstream side, the conveyance paths for feed in which the substrate positioning parts for positioning and holding the substrate in the installation work positions by the component installation mechanisms are disposed, and the return conveyance path which returns the substrate carried from the downstream side to the upstream side and is disposed in the state of being sandwiched between these conveyance paths for feed, in the case of targeting a double-sided mounting substrate, the substrate after single-sided mounting can automatically be returned to the upstream portion and component installation work for which plural substrates including the double-sided mounting substrate are targeted can be done efficiently.

DESCRIPTION OF REFERENCE NUMERALS AND SIGNS

1 ELECTRONIC COMPONENT MOUNTING LINE
8,8* SUBSTRATE
22A FIRST COMPONENT INSTALLATION PART
22B SECOND COMPONENT INSTALLATION PART
23A,23B COMPONENT SUPPLY PART
25 Y-AXIS MOVEMENT TABLE
26A,26B X-AXIS MOVEMENT TABLE
27A,27B INSTALLATION HEAD
L1, L2, L3 SUBSTRATE CONVEYANCE LANE

BEST MODE FOR CARRYING OUT THE INVENTION

Figure 1:
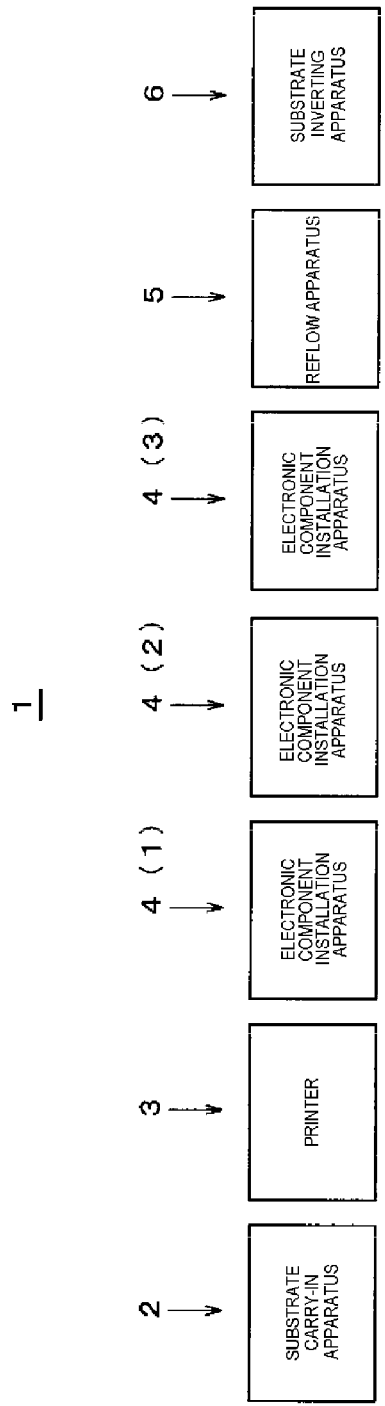
FIG. 1 is a block diagram explaining a configuration of an electronic component mounting line of one embodiment of the invention.
Figure 3:
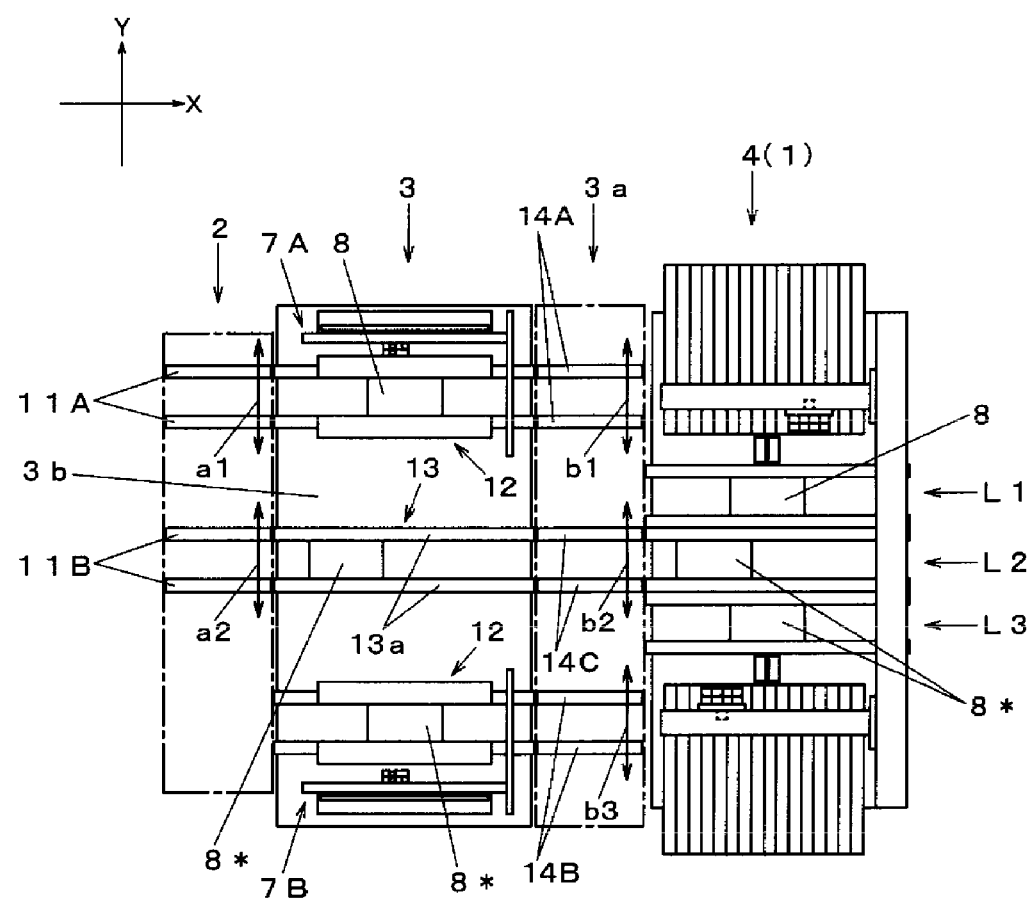
FIG. 3 is a plan view of an electronic component installation apparatus and a printing apparatus constructing the electronic component mounting line of one embodiment of the invention.
Figure 4:
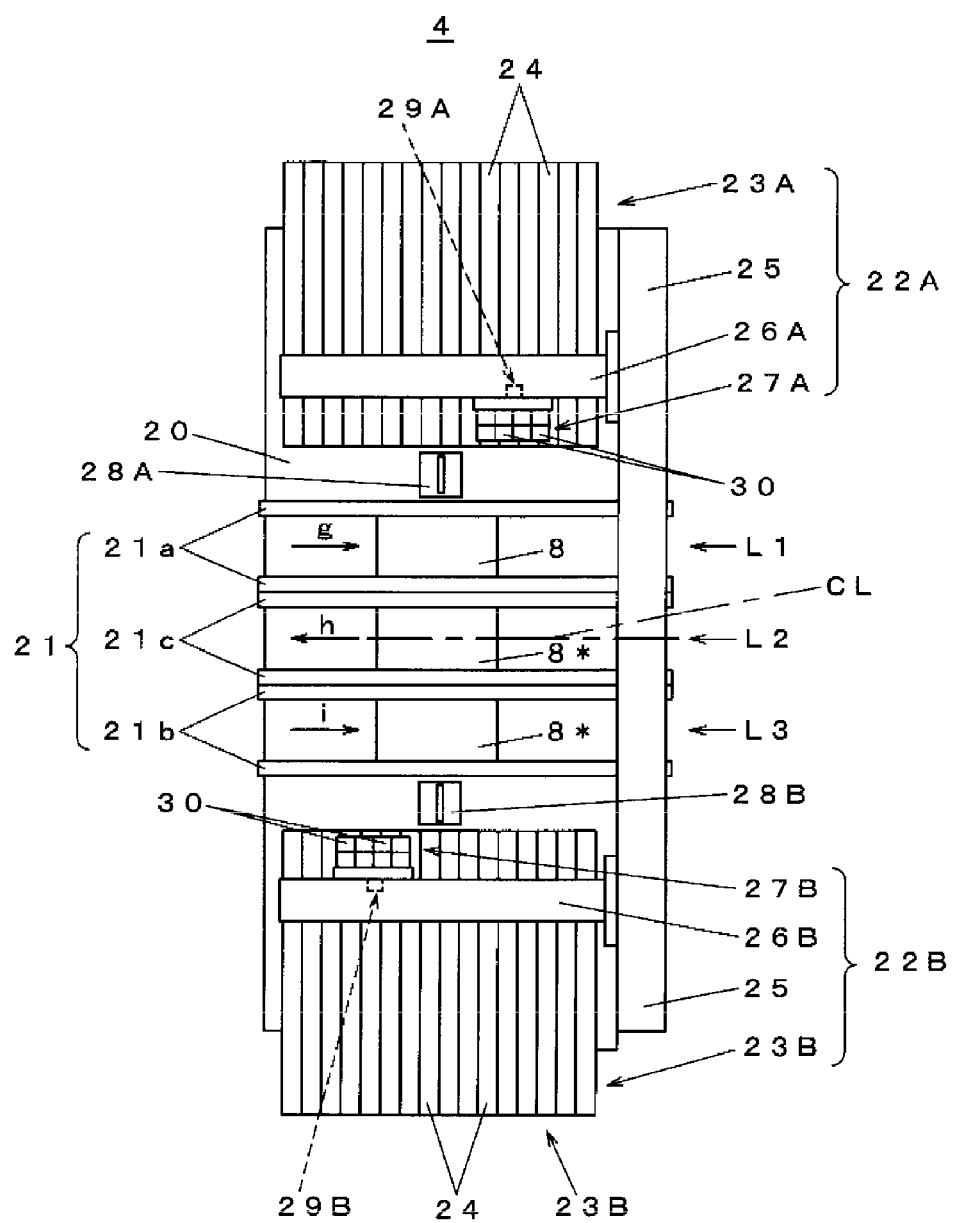
FIG. 4 is a plan view of the electronic component installation apparatus of one embodiment of the invention.
Figure 5:
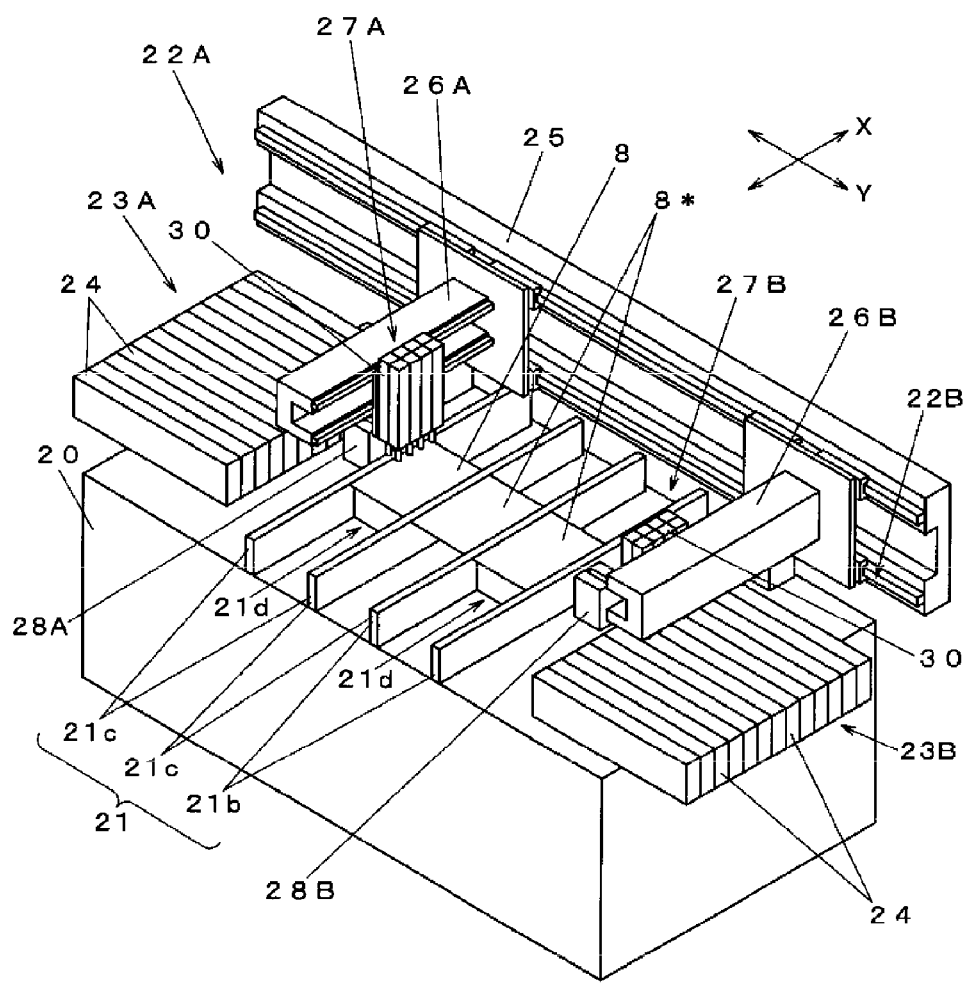
FIG. 5 is a perspective view of the electronic component installation apparatus of one embodiment of the invention.
Figure 6:
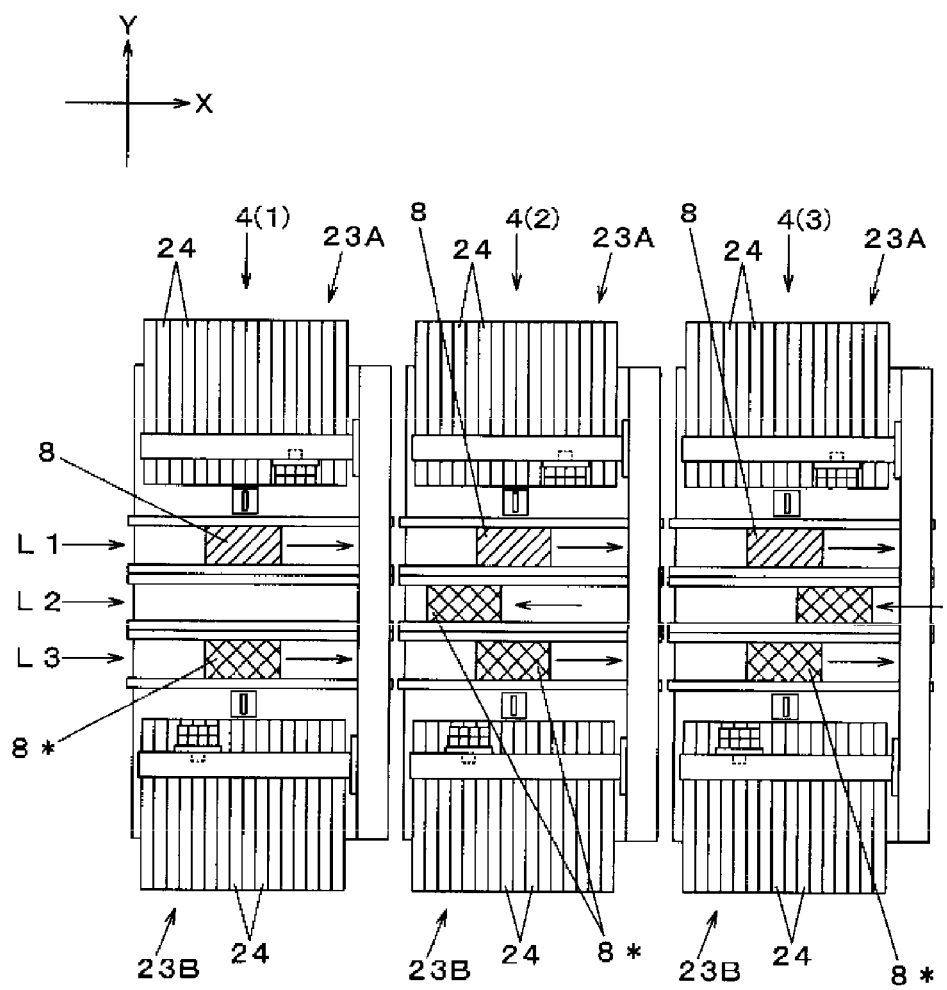
FIG. 6 is an explanatory diagram of a substrate conveyance operation in the electronic component installation apparatus of one embodiment of the invention.
Figure 7:
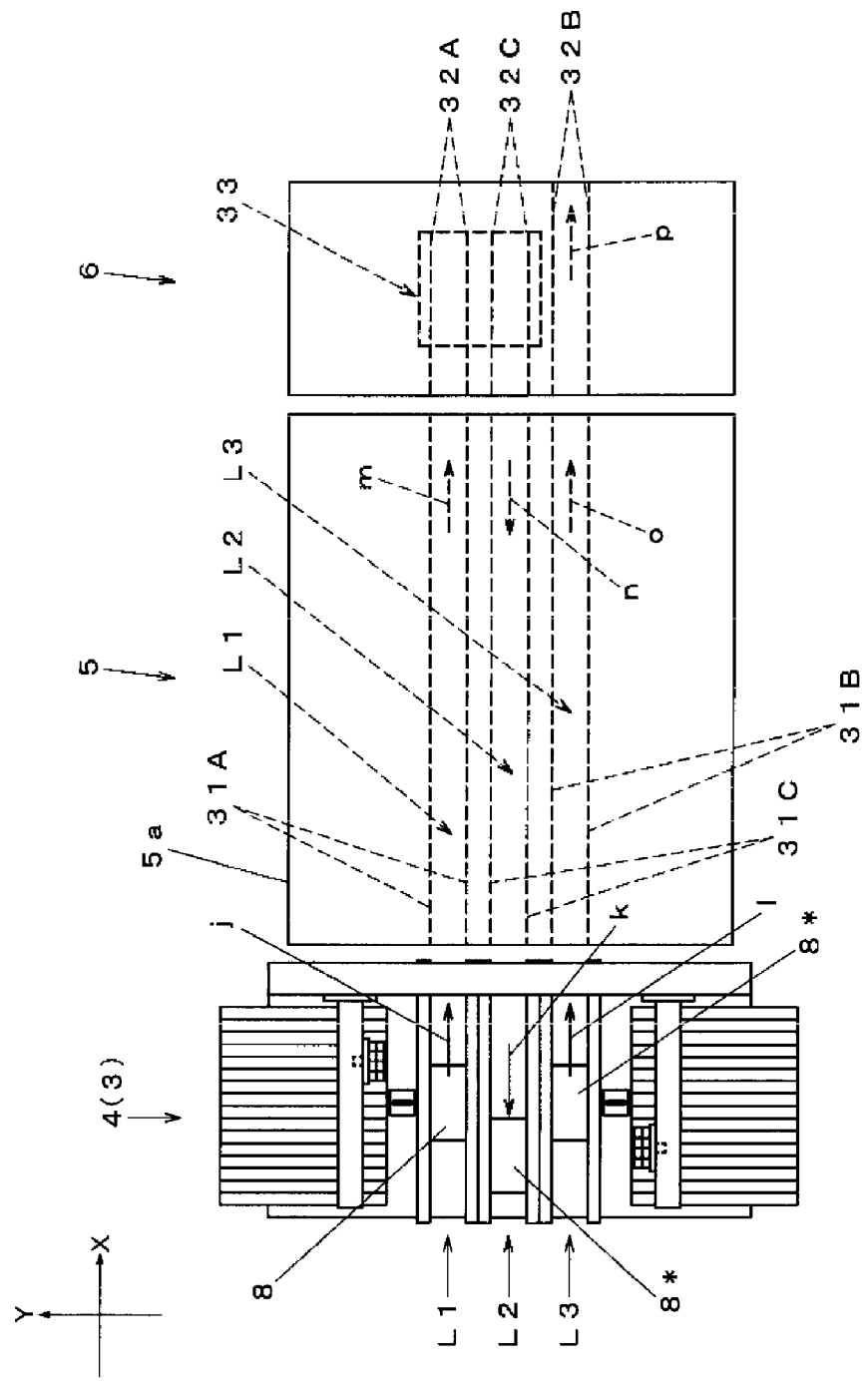
FIG. 7 is a plan view of a substrate inverting apparatus and a reflow apparatus constructing the electronic component mounting line of one embodiment of the invention.
Figure 8:
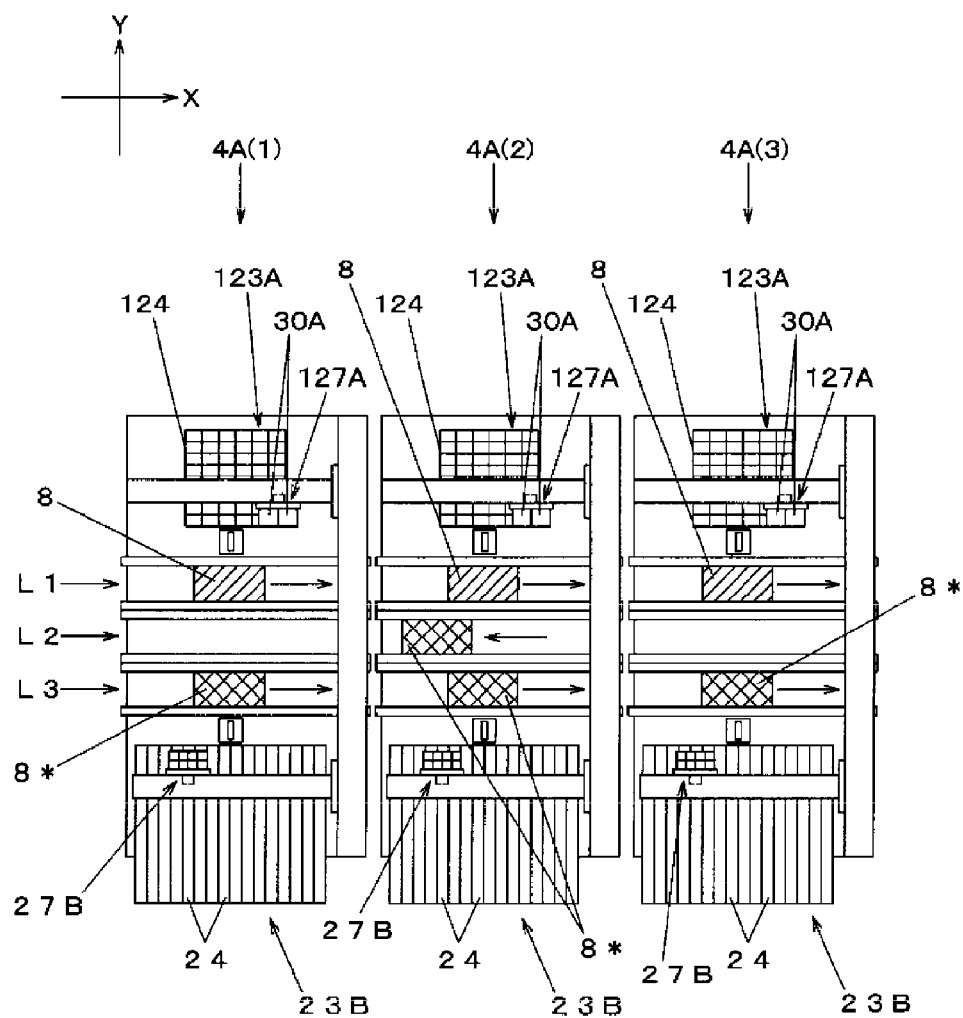
FIG. 8 is an explanatory diagram of a substrate conveyance operation in an electronic component installation apparatus of one embodiment of the invention.

Next, an embodiment of the invention will be described with reference to the drawings. FIG. 1 is a block diagram explaining a configuration of an electronic component mounting line of one embodiment of the invention, and FIG. 2 is a plan view of the electronic component mounting line of one embodiment of the invention, and FIG. 3 is a plan view of an electronic component installation apparatus and a printing apparatus constructing the electronic component mounting line of one embodiment of the invention, and FIG. 4 is a plan view of the electronic component installation apparatus of one embodiment of the invention, and FIG. 5 is a perspective view of the electronic component installation apparatus of one embodiment of the invention, and FIG. 6 is an explanatory diagram of a substrate conveyance operation in the electronic component installation apparatus of one embodiment of the invention, and FIG. 7 is a plan view of a substrate inverting apparatus and a reflow apparatus constructing the electronic component mounting line of one embodiment of the invention, and FIG. 8 is an explanatory diagram of a substrate conveyance operation in an electronic component installation apparatus of one embodiment of the invention.

First, a function and a configuration of an electronic component mounting line 1 will be described with reference to FIGS. 1 and 2. The electronic component mounting line 1 has a function of mounting an electronic component on a substrate and manufacturing a mounting substrate, and is constructed by joining a substrate carry-in apparatus 2, a printing apparatus 3, three electronic component installation apparatuses (hereinafter simply abbreviated as "installation apparatuses") 4(1), 4(2), 4(3), a reflow apparatus 5 and a substrate inverting apparatus 6 in series from the upstream side (left side in FIG. 1) as shown in FIG. 1. The suffixes added to the installation apparatuses (1), (2) . . . respectively show array order from the upstream side in the electronic component mounting line of the apparatuses.

The substrate carry-in apparatus 2 has a function of carrying a substrate (a double-sided mounting substrate in which electronic components are mounted on both of the front and back sides herein) targeted for mounting work in the printing apparatus 3. The printing apparatus 3 prints paste such as cream solder for electronic component bonding on the substrate. The installation apparatuses 4 install the electronic component on the substrate after printing. The substrate passes through the three installation apparatuses 4(1), 4(2), 4(3) to the downstream side and thereby, the plural electronic components are sequentially installed on the substrate. The reflow apparatus 5 solders the installed electronic components to the substrate by heating the substrate on which the electronic components are installed in a predetermined temperature profile. The substrate inverting apparatus 6 has a function of inverting the substrate in which the mounting work on the single side is completed and returning the substrate to the upstream side.

Figure 2:
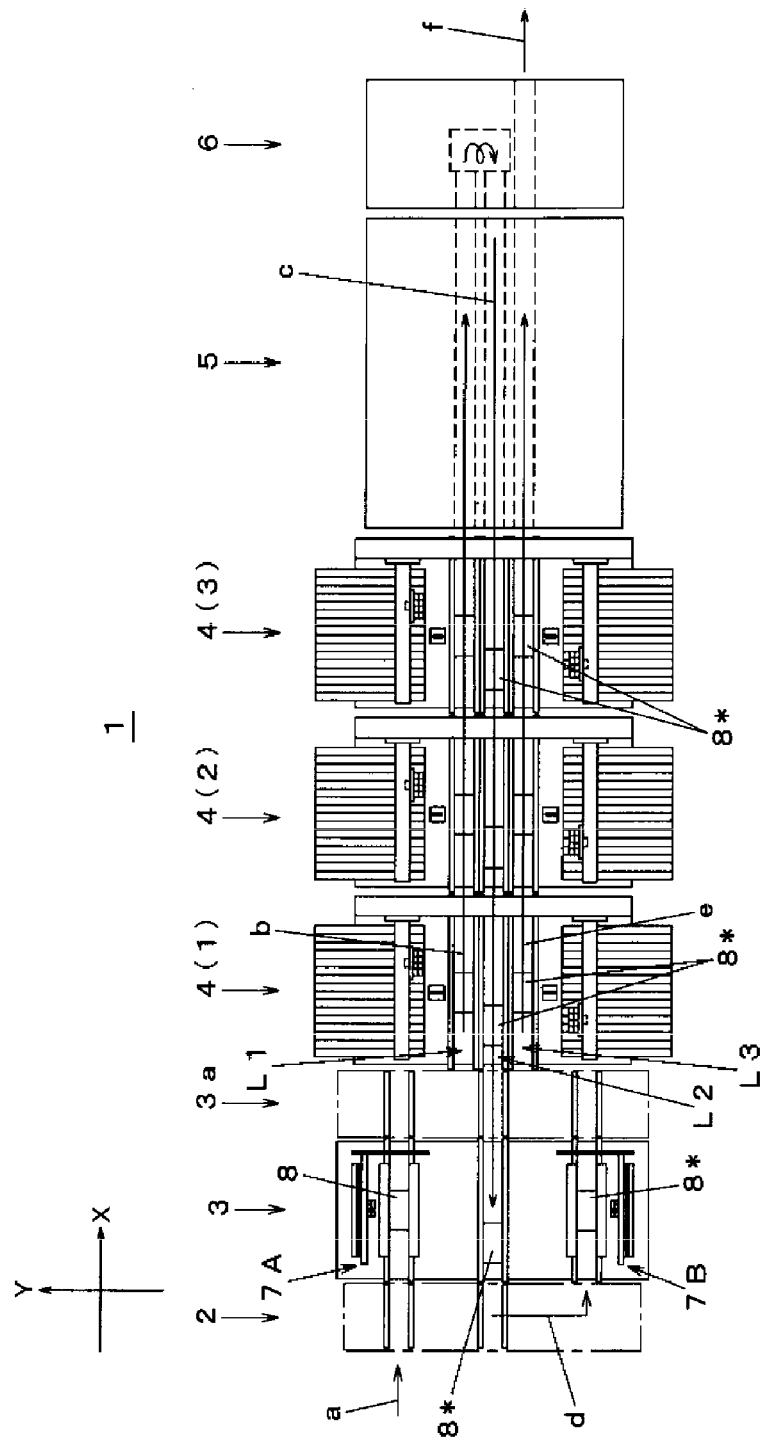
FIG. 2 is a plan view of the electronic component mounting line of one embodiment of the invention.

FIG. 2 shows a movement path of a substrate 8 in the electronic component mounting line 1. As described below, all the installation apparatuses 4 and the printing apparatus 3 constructing the electronic component mounting line 1 have a configuration capable of targeting the two substrates 8 for work concurrently, and the work is done on these substrates 8 while conveying the two substrates 8 always in each of the apparatuses. As shown in FIG. 2, the substrate 8 supplied from the upstream side (arrow a) to the substrate carry-in apparatus 2 is carried in a first screen print part 7A of two screen print parts disposed in the printing apparatus 3 through the substrate carry-in apparatus 2.

In the first screen print part 7A, printing work for which a first surface side of the substrate 8 is targeted is done, and the substrate 8 after printing is passed to the installation apparatuses 4 through a substrate allocation part 3a annexed to the downstream side of the printing apparatus 3. All the installation apparatuses 4(1), 4(2), 4(3) have three substrate conveyance lanes of the substrate conveyance lanes L1, L2, L3. The substrate 8 passed to the installation apparatus 4(1) through the substrate allocation part 3a is carried in the left substrate conveyance lane L1 and thereafter also in the installation apparatuses 4(2), 4(3) and the reflow apparatus 5, work for which the first surface side of the substrate 8 is targeted is done while being conveyed to the downstream side along the substrate conveyance lane L1 (arrow b).

The substrate 8 after soldering for which the first surface side is targeted is performed by the reflow apparatus 5 is passed to the substrate inverting apparatus 6 and herein, the front and back of the substrate 8 are inverted. That is, the substrate 8 (hereinafter represented as a substrate 8*) in which the mounted first surface side is turned to the lower side and an unmounted second surface side is turned to the upper side is carried in the substrate conveyance lane L2 of the reflow apparatus 5 from the downstream side. Then, the substrate 8* is conveyed from the downstream side toward the upstream side (arrow c) through the installation apparatuses 4(3), 4(2), 4(1) and is further transferred to a return conveyance path (see a substrate conveyance conveyor 13a shown in FIG. 3) disposed in the printing apparatus 3 through the substrate allocation part 3a.

The substrate 8* reaching the substrate carry-in apparatus 2 of the upstream side of the printing apparatus 3 is shifted to the side of a second screen print part 7B of the printing apparatus 3 by the substrate carry-in apparatus 2 (arrow d) and is carried in the second screen print part 7B, and printing work for which the second surface side is targeted is done. The substrate 8* after printing is carried in the right substrate conveyance lane L3 of the installation apparatus 4(1) through the substrate allocation part 3a and thereafter also in the installation apparatuses 4(2), 4(3) and the reflow apparatus 5, work for which the second surface side of the substrate 8* is targeted is done while being conveyed to the downstream side along the substrate conveyance lane L3 (arrow e). Then, the substrate 8* after soldering for which the single surface side is targeted is performed by the reflow apparatus 5 is carried out to the downstream side via the substrate inverting apparatus 6 (arrow f).

Next, a configuration of the substrate carry-in apparatus 2 and the printing apparatus 3 and delivery of the substrate 8 between the printing apparatus 3 and the installation apparatuses 4 will be described with reference to FIG. 3. The substrate carry-in apparatus 2 has a function of carrying the substrate 8 supplied from the upstream side in the printing apparatus 3, and respectively includes two substrate conveyance conveyors 11A, 11B capable of conveying the substrate 8 in an X direction. All the substrate conveyance conveyors 11A, 11B are constructed movably in a Y direction (see arrows a1, a2). In the embodiment, the new substrate 8 supplied from the upstream side is carried in the printing apparatus 3 through the substrate conveyance conveyor 11A. The substrate conveyance conveyor 11B is used for again carrying the substrate 8* of an inverted state returned from the downstream side in the printing apparatus 3 as described below.

The printing apparatus 3 is constructed so that the first screen print part 7A and second screen print part 7B having a function of printing paste for electronic component bonding on the substrate 8 targeted for mounting work are placed on a common base 3b symmetrically with respect to a line centerline of the electronic component mounting line 1 in plan view. A substrate conveyance part 13 capable of reversibly conveying the substrate 8 in a substrate conveyance direction (X direction) by the substrate conveyance conveyor 13a is arranged between the first screen print part 7A and the second screen print part 7B. All the first screen print part 7A and the second screen print part 7B include substrate positioning parts 12, and the substrate 8 carried in the printing apparatus 3 through the substrate conveyance conveyor 11A is positioned by the substrate positioning part 12 of the first screen print part 7A. Also, the substrate 8* returned from the downstream side is again carried in the printing apparatus 3 through the substrate conveyance conveyor 11B, and is positioned by the substrate positioning part 12 of the second screen print part 7B.

The substrate allocation part 3a including three substrate conveyance conveyors 14A, 14C, 14B capable of conveying the substrate 8 in the X direction is annexed to the downstream side of the printing apparatus 3. All the substrate conveyance conveyors 14A, 14C, 14B are constructed movably in the Y direction (arrows b1, b2, b3), and the substrate conveyance conveyor 14A delivers the substrate 8 between the substrate positioning part 12 of the first screen print part 7A and the substrate conveyance lane L1 of the installation apparatus 4(1). The substrate conveyance conveyor 14B delivers the substrate 8 between the substrate positioning part 12 of the second screen print part 7B and the substrate conveyance lane L3 of the installation apparatus 4(1). Also, the substrate conveyance conveyor 14C delivers the substrate 8 between the substrate conveyance part 13 and the substrate conveyance lane L2 of the installation apparatus 4(1).

Next, a structure of the installation apparatuses 4 will be described with reference to FIGS. 4 and 5. The installation apparatuses 4(1), 4(2), 4(3) have the same configuration, and all the installation apparatuses have a function of constructing an electronic component mounting line by being joined to the downstream side of a screen printing apparatus for printing paste for electronic component bonding on a substrate and installing electronic components on the substrate. A substrate conveyance part 21 having three pairs of substrate conveyance rails 21a, 21b, 21c arranged in the substrate conveyance direction (X direction) is arranged in the center of a base 20. In the substrate conveyance rails 21a, 21b, 21c, the upstream lateral side constructs the three substrate conveyance lanes L1, L2, L3 for conveying the substrate 8 passed from the apparatus of the downstream side inside the apparatus.

In the embodiment, mounting stages including substrate positioning parts 21d for positioning and holding the substrate 8 in installation work positions in only the substrate conveyance lanes L1, L3 located in both sides of the three substrate conveyance lanes L1, L2, L3 are disposed in correspondence with each of the following two component installation parts (a first component installation part 22A, a second component installation part 22B). The substrate 8 or the substrate 8* carried in the substrate conveyance lanes L1, L3 of both sides is conveyed from the upstream side toward the downstream side (see arrows g, i). With respect to the substrate 8 carried in the substrate conveyance lane L1, electronic component installation work for which the first surface side is targeted is done by the first component installation part 22A, and with respect to the substrate 8* carried in the substrate conveyance lane L3, electronic component installation work for which the second surface side is targeted is done by the second component installation part 22B. The substrate conveyance lane L2 located in the center is constructed so as to function as a return conveyance path for conveying the substrate 8* carried from the downstream side apparatus from the downstream side toward the upstream side (see arrow h).

Outside the substrate conveyance rails 21a, 21b, the first component installation part 22A and the second component installation part 22B are respectively placed symmetrically with respect to a line centerline CL (see FIG. 4) of the electronic component mounting line 1 in plan view. The first component installation part 22A and the second component installation part 22B are configured to respectively have component supply parts 23A, 23B for supplying the electronic components mounted on the substrate 8 and the following component installation mechanisms. Plural tape feeders 24 are juxtaposed to the component supply parts 23A, 23B, and the tape feeders 24 supply the electronic components in a component pickup position by the component installation mechanisms by feeding a carrier tape in which the electronic components mounted on the substrate 8 are held at a pitch. Y-axis movement tables 25 are arranged in the end of the X direction side of the base 20, and installation heads 27A, 27B are respectively attached to two X-axis movement tables 26A, 26B coupled to the Y-axis movement tables 25. The installation heads 27A, 27B include plural unit installation heads 30, and the electronic components are held by vacuum suction by a suction nozzle attached to each of the unit installation heads 30.

The installation heads 27A, 27B move horizontally in the X direction and the Y direction by driving the Y-axis movement tables 25 and the X-axis movement tables 26A, 26B. Consequently, the installation heads 27A, 27B respectively suck and take the electronic components out of the tape feeders 24 of the component supply parts 23A, 23B, and transfer and install the electronic components to the substrate 8 positioned and held in the mounting stages of the substrate conveyance rails 21a, 21b by the substrate positioning parts 21d. The Y-axis movement table 25, the X-axis movement table 26A and the installation head 27A, and the Y-axis movement table 25, the X-axis movement table 26B and the installation head 27B respectively construct the component installation mechanisms for taking the electronic components out of the component supply parts 23A, 23B and transferring and installing the electronic components to the substrate 8 or the substrate 8*.

Component recognition cameras 28A, 28B are disposed in movement paths of the installation heads 27A, 27B, and the installation heads 27A, 27B by which the electronic components are held move the upper portions of the component recognition cameras 28A, 28B and thereby, the component recognition cameras 28A, 28B image and recognize the electronic components held by the installation heads 27A, 27B from the lower portions. Also, substrate recognition cameras 29A, 29B moving integrally are disposed in the lower sides of the installation heads 27A, 27B. The installation heads 27A, 27B move to the mounting stages described above and thereby, the substrate recognition cameras 29A, 29B image the substrate 8 positioned in the mounting stages and recognize positions.

FIG. 6 shows a conveyance operation of the substrate in a configuration of joining the three installation apparatuses 4 in series. That is, also in all the installation apparatuses 4(1), 4(2), 4(3), the substrate conveyance lane L1 and the substrate conveyance lane L3 respectively convey the substrate 8 and the substrate 8* to the downstream side. Then, the substrate conveyance lane L2 disposed in a state of being sandwiched between the substrate conveyance lane L1 and the substrate conveyance lane L3 conveys the substrate 8* to the upstream side. That is, the installation apparatuses 4 are configured to have two conveyance paths for feed (substrate conveyance lanes L1, L3) which feed the substrate carried from the upstream side to the downstream side, the conveyance paths for feed in which the substrate positioning parts 21d are disposed, and a return conveyance path (substrate conveyance lane L2) which returns the substrate carried from the downstream side to the upstream side and is disposed in a state of being sandwiched between these two conveyance paths for feed.

Next, a function of the substrate inverting apparatus 6 and the reflow apparatus 5 will be described with reference to FIG. 7. The reflow apparatus 5 is configured to dispose substrate conveyance conveyors 31A, 31C, 31B for conveying the substrate 8 in the X direction in a furnace body 5a for holding the inside at a predetermined reflow temperature. The substrate conveyance conveyors 31A, 31C, 31B respectively construct the substrate conveyance lanes L1, L2, L3 by being joined to the installation apparatus 4(3). The substrate inverting apparatus 6 is joined to the downstream side of the reflow apparatus 5. The substrate inverting apparatus 6 includes substrate conveyance conveyors 32A, 32C, 32B for conveying the substrate 8 in the X direction, and the downstream portions of the substrate conveyance conveyors 32A, 32C are joined to a substrate inverting unit 33. The substrate inverting unit 33 has a function of inverting the substrate 8 carried by the substrate conveyance conveyor 32A and passing the substrate 8 to the substrate conveyance conveyor 32C.

In the configuration of the substrate inverting apparatus 6 and the reflow apparatus 5 described above, the substrate 8 passed from the substrate conveyance lane L1 of the installation apparatus 4(3) to the reflow apparatus 5 (see arrow j) is conveyed to the downstream side by the substrate conveyance conveyor 31A inside the reflow apparatus 5 (arrow m) and during this time, the substrate 8 is heated and the electronic components installed on the first surface side are soldered. The substrate 8 after soldering is passed to the substrate inverting apparatus 6 and the front and back of the substrate 8 are inverted by the substrate inverting unit 33 and then the substrate 8 is conveyed to the upstream side through the substrate conveyance lane L2 by the substrate conveyance conveyor 31C of the reflow apparatus 5 through the substrate conveyance conveyor 32C (arrow n) and further is passed to the substrate conveyance lane L2 of the installation apparatus 4(3) (see arrow k).

The substrate 8* passed from the substrate conveyance lane L3 of the installation apparatus 4(3) to the reflow apparatus 5 (see arrow l) is conveyed to the downstream side by the substrate conveyance conveyor 31B inside the reflow apparatus 5 (arrow o) and during this time, the substrate 8* is heated and the electronic components installed on the second surface side are soldered. The substrate 8* after soldering is passed to the substrate inverting apparatus 6 and is conveyed to the downstream side by the substrate conveyance conveyor 32B (see arrow p) and is carried out to the downstream side of the electronic component mounting line 1.

In addition, the example of placing the tape feeders 24 for supplying small chip components mainly in all the component supply part 23A and the component supply part 23B as the installation apparatus 4 has been shown in FIG. 6, but an installation apparatus 4A as shown in FIG. 8 may be used as a kind of electronic component installation apparatus in the electronic component mounting line 1. That is, the installation apparatus 4A is configured to place a component supply part 123A including a tray feeder 124 for supplying large components such as QFP instead of the component supply part 23A shown in FIG. 6 and use an installation head 127A to which a unit installation head 30A corresponding to these large components is attached. Also in the installation apparatus 4A of such a configuration, a substrate conveyance operation similar to that of the example shown in FIG. 6 is performed.

As described above, the installation apparatus 4 shown in the embodiment is configured to include the substrate conveyance lane L2 as the return conveyance path which returns the substrate 8* carried from the downstream side to the upstream side and is sandwiched between the substrate conveyance lanes L1, L3 as the two conveyance paths for feed which feed the substrate 8 and the substrate 8* carried from the upstream side to the downstream side, the conveyance paths for feed in which the substrate positioning parts 21d for positioning and holding the substrate in the installation work positions by the first component installation part 22A and the second component installation part 22B are disposed. Consequently, in the case of targeting a double-sided mounting substrate of the front and back, the substrate 8* after single-sided mounting can automatically be returned to the upstream portion, and component installation work for which plural substrates including the double-sided mounting substrate are targeted can be done efficiently.

In addition, as the configuration of the electronic component installation apparatus in the invention, as shown in the installation apparatuses 4, 4A shown in the embodiment, a single apparatus in which a pair of component installation parts is placed in one base may be used and also a configuration in which a function of the plural installation apparatuses 4, 4A is arranged on a common base may be used.

The invention has been described in detail with reference to the specific embodiment, but it is apparent to those skilled in the art that various changes or modifications can be made without departing from the spirit and scope of the invention.

The present application is based on Japanese patent application No. 2008-097906 filed on Apr. 4, 2008, and the contents of the patent application are hereby incorporated by reference.

INDUSTRIAL APPLICABILITY

An electronic component installation apparatus of the invention has an effect capable of efficiently doing component installation work for which plural substrates including a double-sided mounting substrate are targeted, and is useful in an electronic component mounting field in which an electronic component is mounted on a substrate and a mounting substrate is manufactured.

The invention claimed is:

1. An electronic component mounting line comprising an electronic component installation apparatus which installs an electronic component on a substrate, and a substrate inverting apparatus which is located in a downstream side of the electronic component installation apparatus and inverts the substrate having the electronic component installed thereon, wherein the electronic component installation apparatus comprises:

two component installation parts having component supply parts for supplying electronic components mounted on the substrate and component installation mechanisms for taking the electronic components out of the component supply parts and transferring and installing the electronic components to the substrate, the component installation parts being placed symmetrically with respect to a line centerline of the electronic component mounting line in plan view, two substrate positioning parts which are disposed in correspondence with each of the two component installation parts and position and hold the substrate in installation work positions by the component installation mechanisms, two conveyance paths for feed which respectively feed the substrate carried from the upstream side to the downstream side, the conveyance paths for feed in which the substrate positioning parts are disposed, and a return conveyance path which returns the substrate carried from the downstream side to the upstream side and is disposed in a state of being sandwiched between the two conveyance paths for feed, wherein the substrate inverting apparatus comprises a substrate inverting unit, wherein the substrate inverting unit is joined to one of the two conveyance paths and the return conveyance path, inverts the substrate carried by the one of the two conveyance paths, and passes the inverted substrate to the return conveyance path.

2. The electronic component mounting line according to claim 1, wherein the installation apparatus is arranged to be capable of targeting two of the substrates for work concurrently in the two conveyance paths.

3. The electronic component mounting line according to claim 1, further comprising:

a printing apparatus which is joined to an upstream side of the electronic component installation apparatus and prints paste for the electronic component bonding on the substrate;

a substrate carry-in apparatus which is joined to an upstream side of the printing apparatus and carries the substrate targeted for mounting work in the printing apparatus; and a reflow apparatus which is joined to a downstream side of the electronic component installation apparatus and heats the substrate on which the electronic components are installed in a predetermined temperature profile so that the installed electronic components are soldered on one side of the substrate.

4. The electronic component mounting line according to claim 3, wherein each of the installation apparatus and the printing apparatus is arranged to be capable of targeting two of the substrates for work concurrently in the two conveyance paths.

5. The electronic component mounting line according to claim 3, wherein the substrate is inverted by the substrate inverting apparatus, after a soldering targeted to a first surface side of the substrate conveyed in one of the two conveyance paths is performed by the reflow apparatus, the substrate is conveyed in the return conveyance path in a state that an unmounted second surface side is turned to an upper side to reach the substrate carry-in apparatus, and the substrate is shifted to the other of the two conveyance path and conveyed therein so that a soldering targeted to a second surface side of the substrate is performed by the reflow apparatus.

\* \* \* \* \*